(12) United States Patent
Wolford

(10) Patent No.: US 6,493,285 B1
(45) Date of Patent: Dec. 10, 2002

(54) METHOD AND APPARATUS FOR SAMPLING DOUBLE DATA RATE MEMORY READ DATA

(75) Inventor: Barry Joe Wolford, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/925,266

(22) Filed: Aug. 9, 2001

(51) Int. Cl.[7] ................................................. G11C 7/00
(52) U.S. Cl. .................. 365/233; 365/189.01; 365/194; 365/189.05; 365/239
(58) Field of Search ....................... 365/189.01, 189.05, 365/194, 239, 233

(56) References Cited

U.S. PATENT DOCUMENTS 6,243,279 B1 * 6/2001 Maesako et al. .............. 365/49
6,266,750 B1 * 7/2001 Demone et al. ............. 711/169
6,377,501 B2 * 4/2002 Maesako et al. ........ 365/230.03
2002/0010831 A1 * 1/2002 DeMone et al. ............. 711/105
2002/0087768 A1 * 7/2002 Srikanth et al. ............. 710/118

* cited by examiner

Primary Examiner—Viet Q. Nguyen
(74) Attorney, Agent, or Firm—Carr Law Firm, L.L.P.; Robert M. Carwell

(57) ABSTRACT

A flexible, software configurable DDR read data path structure provides independently programmable sample stage and sample cycle capability. It also provides the capability to independently delay a read sample stage clock to support a wider range of data and data strobe (DQS) arrival times over a broad frequency range and subsequent sample stages to compensate for any resultant read cycle compression within any source synchronous interface. An SDRAM timing register is used to control read data path structure by changing bits in the register.

10 Claims, 4 Drawing Sheets

US 6,493,285 B1

METHOD AND APPARATUS FOR SAMPLING DOUBLE DATA RATE MEMORY READ DATA

BACKGROUND OF THE INVENTION

1. Field of the Invention

The invention relates generally to a read data path structure in a double data rate (DDR) source-synchronous interface and, more particularly, to a software configurable read data path structure in a double data rate (DDR) synchronous dynamic random access memory (SDRAM) interface.

2. Description of the Related Art

Double Data Rate (DDR) synchronous dynamic random access memory (SDRAM) provides source synchronous read data in that a read data strobe (DQS) is propagated with read data. DDR read data is initially sampled in the DDR DQS clock domain and must be synchronized to the DDR memory controller internal clock domain for transfer. The DDR read data and DQS are propagated from the DDR memory to the DDR memory controller and derived from the DDR memory clock input, which is typically generated by the DDR memory controller and re-buffered and distributed either on-chip or off-chip. Thus, there is a potential for a widely varying range of read data and read DQS arrival times, across different implementations, relative to the memory controller's fixed internal clock domain(s).

Therefore, what is needed is a flexible DDR read data path structure to support a wide range of read data and DQS arrival times, adaptable to different implementations.

SUMMARY OF THE INVENTION

The present invention provides a read data path structure in a double data rate (DDR) source-synchronous interface such as a DDR synchronous random access memory (SDRAM) interface. The read data path structure comprises a first stage comprising a first flip-flop (FF) and a transparent latch (XL). The read data path structure also comprises a second stage comprising a second FF and a third FF. The input of the second FF is connected to the output of the first FF, whereas the input of the third FF is connected to the output of the XL.

The read data path structure further comprises a third stage comprising a fourth FF and a fifth FF. The input of the fourth FF is connected to the output of the second FF, whereas the input of the fifth FF is connected to the output of the third FF.

Additionally, the read data path structure comprises a first multiplexer having at least one input connected to the output of the first FF, at least one input connected to the output of the second FF, and at least one input connected to the output of the fourth FF. The first multiplexer is controlled by at least two bits of an SDRAM timing register.

The read data path structure further comprises a second multiplexer having at least one input connected to the output of the XL, at least one input connected to the output of the third FF, and at least one input connected to the output of the fifth FF. The second multiplexer is controlled by the at least two bits of the SDRAM timing register.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION

The present invention provides a flexible, software configurable DDR read data path structure with independently programmable sample stage and sample cycle capability. Furthermore, the present invention provides the capability to independently delay a read sample stage clock to support a wider range of read data and DQS arrival times over a broad frequency range. It also provides subsequent sample stages to compensate for any resultant read cycle compression.

The principles of the present invention and their advantages are best understood by referring to the illustrated embodiments and the operation thereof depicted in FIGS. 1–5.

Figure 1:
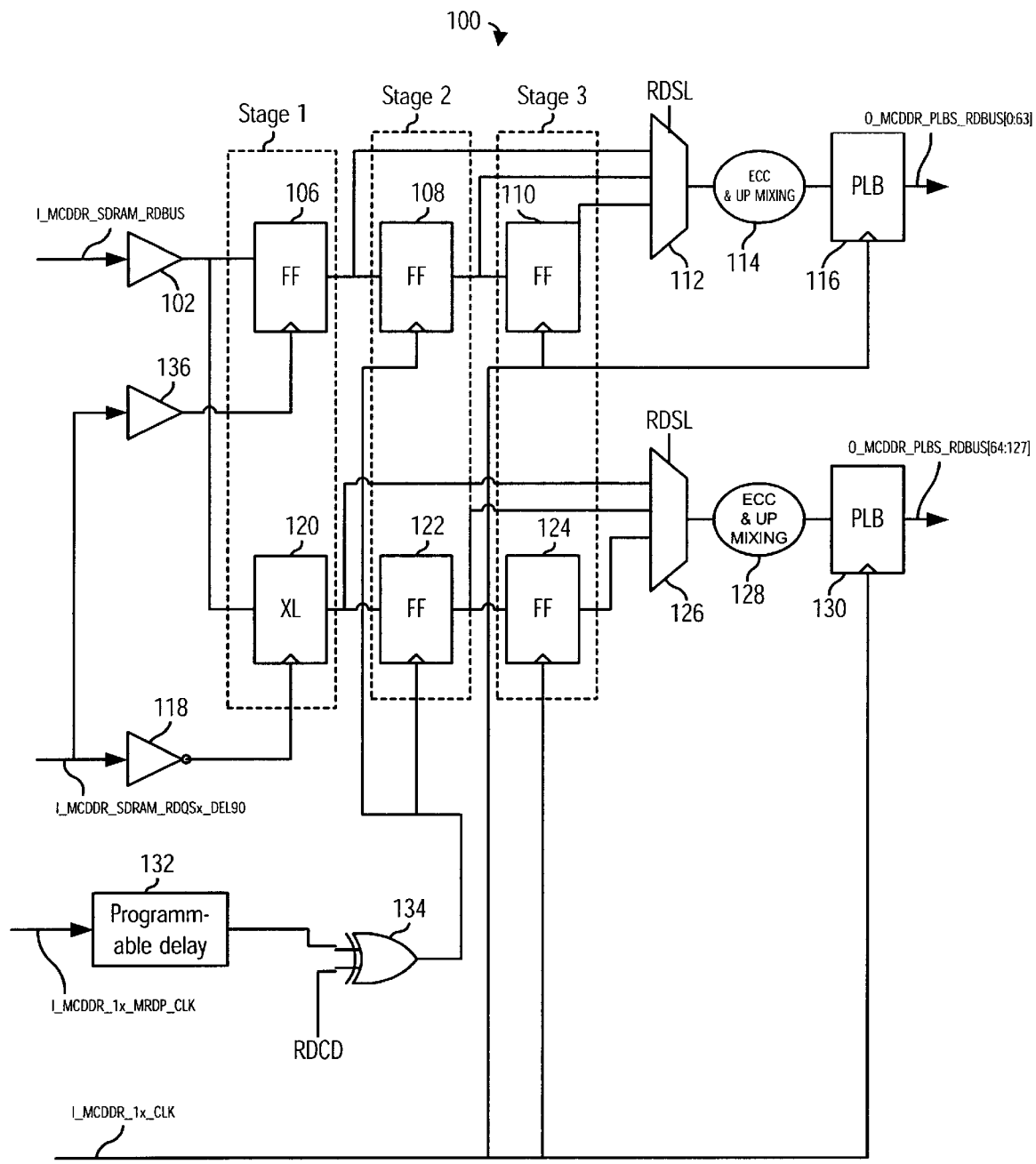
FIG. 1 depicts, at a logic circuit level, an exemplary block diagram of a DDR read data path structure embodying features of the present invention.

In FIG. 1, the reference numeral 100 designates a circuit describing a DDR read data path structure. The input of a buffer 102 is preferably connected to a read data bus (not shown) for receiving a read data input I_CDDR_SDRAM_RDBUS, which is error correcting code (ECC) check-bit portion of the memory data bus signal. The disclosed data path structure is generally applicable to any data read from a memory including the ECC check bits. The read data bus is preferably 64 bits wide; however, the present invention allows for read data buses of different data widths. The output of the buffer 102 is connected to an input of a flip-flop (FF) 106. The output of the FF 106 is connected to an input of a FF 108. The output of the FF 108 is connected to an input of a FF 110. Each output of the FFs 106, 108, and 110 is also connected to an input of a multiplexer 112. The output of the multiplexer 112 is connected to an input of a circuit 114, which contains an ECC and data path multiplexing (DP-muxing) functionality. The multiplexer 112 is preferably controlled by read sample stage select (RDSL) bits consisting of two bits of an SDRAM timing register 2 (SDTR2). The output of the circuit 114 is connected to an input of a Processor Local Bus (PLB) read sample point register 116.

The input of an inverter 118 preferably receives I_MCDDR_SDRAM_RDQSx_DEL90 signal, which is a source synchronous clock signal that is received from a DDR memory device. For example, the signal can be a read DQS. The output of the inverter 118 is connected to a clock input of a transparent latch (XL) 120. The output of the XL 120 is connected to an input of a FF 122. The output of the FF 122 is connected to an input of a FF 124. Each output of the XL 120, the FF 122, and the FF 124 is also connected to an input of the multiplexer 126. The output of the multiplexer 126 is connected to a circuit 128, which contains an ECC and DP-muxing functionality. The multiplexer 126 is preferably controlled by the same RDSL bits used in the multiplexer 112. The output of the circuit 128 is connected to an input of a PLB read sample point register 130.

A programmable delay 132 preferably receives a clock signal I_MCDDR_1x_MRDP_CLK, which is the memory read data path clock. This clock signal may originate from an on-chip or off-chip source, depending on the implementation, and is ultimately derived from a system (on-chip or off-chip) level phase locked loop (PLL). The output of the programmable delay 132 is connected to an XOR gate 134. The output of the XOR gate 134 is connected to the clock inputs of the FFs 108 and 122.

The FF 106 is preferably clocked by a read data strobe (DQS) through a buffer 136. The FFs 110 and 124, and the PLBs 116 and 130 are preferably clocked by I_LMCDDR_1x_CLK, the main core 1xclock. The main core 1xclock is a system level clock which controls much of memory controller interface logic (not shown) and is generally equivalent in frequency to a memory clock.

In FIG. 1, the circuit 100 preferably comprises three stages of registers for both upper data and error correction code (ECC) check bits and lower data and ECC check bits. Stage 1 consists of the FF 106 for the upper data path and the XL 120 for the lower data path. The upper data is captured into the FF 106 with the rising edge of read DQS, while the lower data flushes through the XL 120 when the read DQS is high and captured and held with the falling edge of read DQS.

Stage 2 consists of the FF 108 for the upper data path and the FF 122 for the lower data path. Stage 2 is preferably clocked by the I_MCDDR_1x_MRDP_CLK which has programmable delay capability in one coarse delay of one half cycle as well as a finer delay capability using the read clock delay tuning bits. The coarse half-cycle delay is provided primarily for column address strobe (CAS) Latency 2.5 support and enables read data to be captured into Stage 2 while compensating for the half-cycle latency adder and allowing proper synchronization with the internal core clock domain. The delay effect of the read clock delay tuning bits depends upon many factors including the physical placement of the delay line, ASIC process variation, and voltage/temperature variations.

Stage 3 consists of the FF 110 for the upper data path and the FF 124 for the lower data path. Stage 3 is clocked by I_MCDDR_1x_CLK, the main core 1xclock. The final relative clock domain synchronization occurs at the PLB read sample point registers 116 and 130. The various aspects of the DDR read data path structure as shown in FIG. 1 are preferably controlled via a 32-bit configuration register as shown in FIG. 2.

Figure 2:
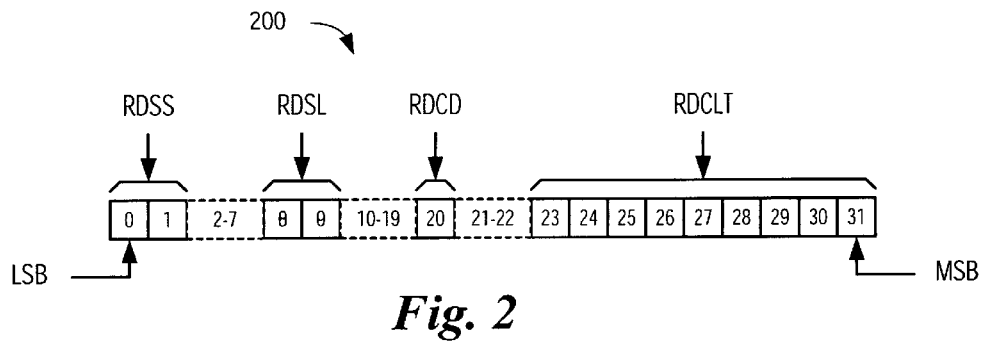
FIG. 2 depicts an SDRAM timing register 2 (SDTR2)

In FIG. 2, bits 0 and 1 are read sample cycle select (RDSS) bits. Bit 0 indicates the least significant bit (LSB) and bit 1 indicates the second LSB. For bits 0 and 1,00 indicates a T0 sample, 01 indicates a T1 sample, 10 indicates a T2 sample, and 11 indicates a T3 sample. Bits 8 and 9 are read sample stage select (RDSL) bits. For bits 8 and 9, "00" indicates Stage 1, "01" indicates Stage 2, and "10" indicates Stage 3. "11" is reserved for other purposes. Bit 20 is read clock delay (RDCD) bits, for which 0 indicates a clock delay of 0 and 1 indicates a half-cycle clock delay.

Bits 23 through 31 are read clock delay tuning (RDCLT) bits. Bit 31 indicates the most significant bit (MSB). More specifically, bits 30 and 31 select increments of a quarter delay element and bits 23 through 29 select increments of a single delay element. The bits 2–7, 10–19, and 21–22 are reserved for other purposes.

Within SDTR2, the RDSL setting determines which of the three Stages will be the source of the data steered to the input of the PLB read sample point registers 116 and 130. The critical path within the memory subsystem timing budget for a DDR application will be the lower read data launched and propagated with the falling edge of read DQS. In order to use Stage 1, lower read data and DQS must arrive early enough such that the data can flush through the XL 120 downstream and meet the setup and hold time requirements at the PLB read sample point register 130. Note that the setup and hold time requirements at the PLB read sample point register 130 will differ for ECC-enabled and ECC-disabled applications.

If the lower read data and DQS arrival is such that the downstream setup time requirements cannot be met at the PLB read sample point register along the Stage 1 path, Stage 2 may be used, provided that the lower read data arrival is such that the setup and hold time requirements at Stage 2 can be met. In the event that the lower read data and DQS arrival is such that the read data does not meet the setup time requirements at Stage 2, the Stage 2 sample clock may be delayed such that the setup and hold time requirements can be met to enable the read data to be captured.

Stage 3 is provided as a final synchronization option for circumstances (read data and DQS arrival) in case the Stage 2 sample clock is delayed to the point where the register-to-register timing path between Stage 2 and the downstream Processor Local Bus Slave (PLBS) read sample point registers 116 and 130 can no longer be met. Such a circumstance may, for example, be running a CAS Latency 2.5 device with the Stage 2 read sample clock delayed by a half cycle or more (through the combination of RDCD and RDCLT settings) with ECC enabled at a high frequency. If necessary, data can be captured directly into Stage 3 and then passed to the PLB read sample point registers 116 and 130 in the following clock cycle.

Figure 3:
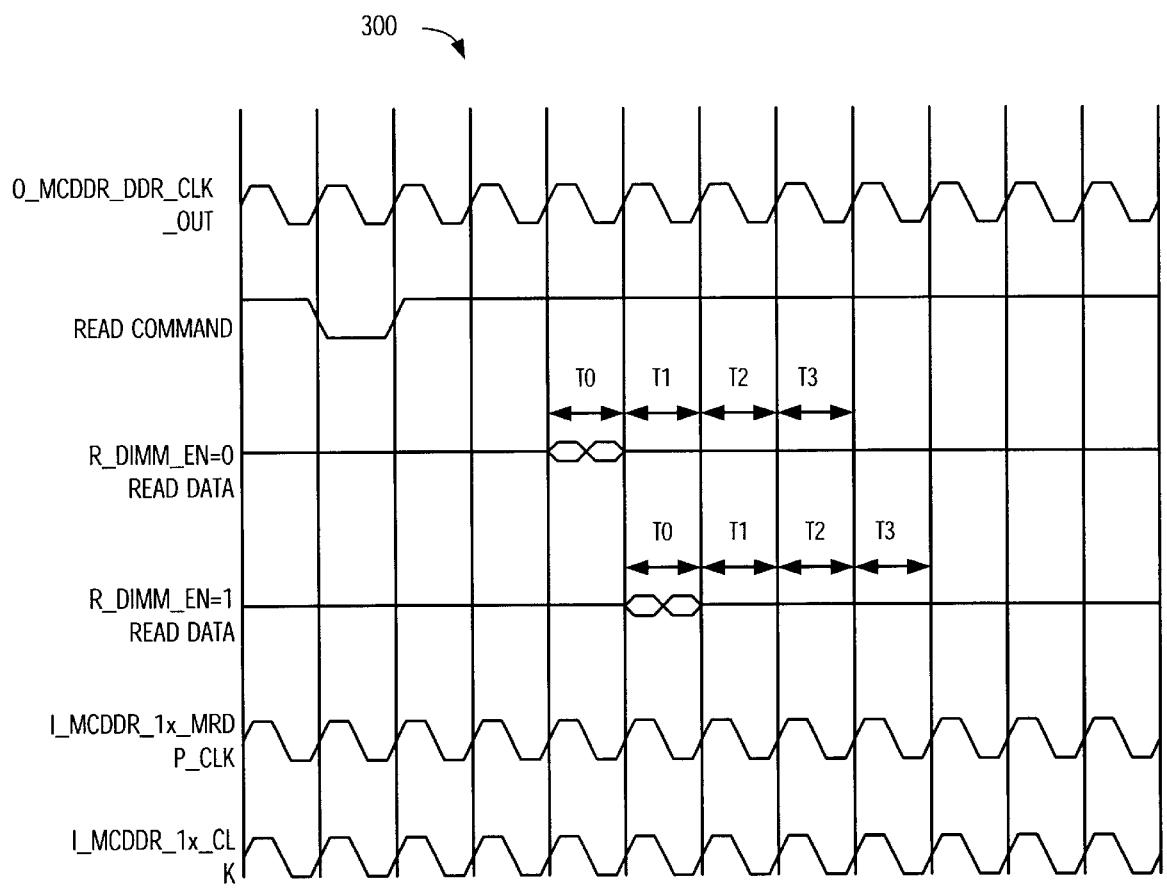
FIG. 3 depicts a timing diagram showing a read sample cycle for column address strobe (CAS) Latency 2 devices.
Figure 4:
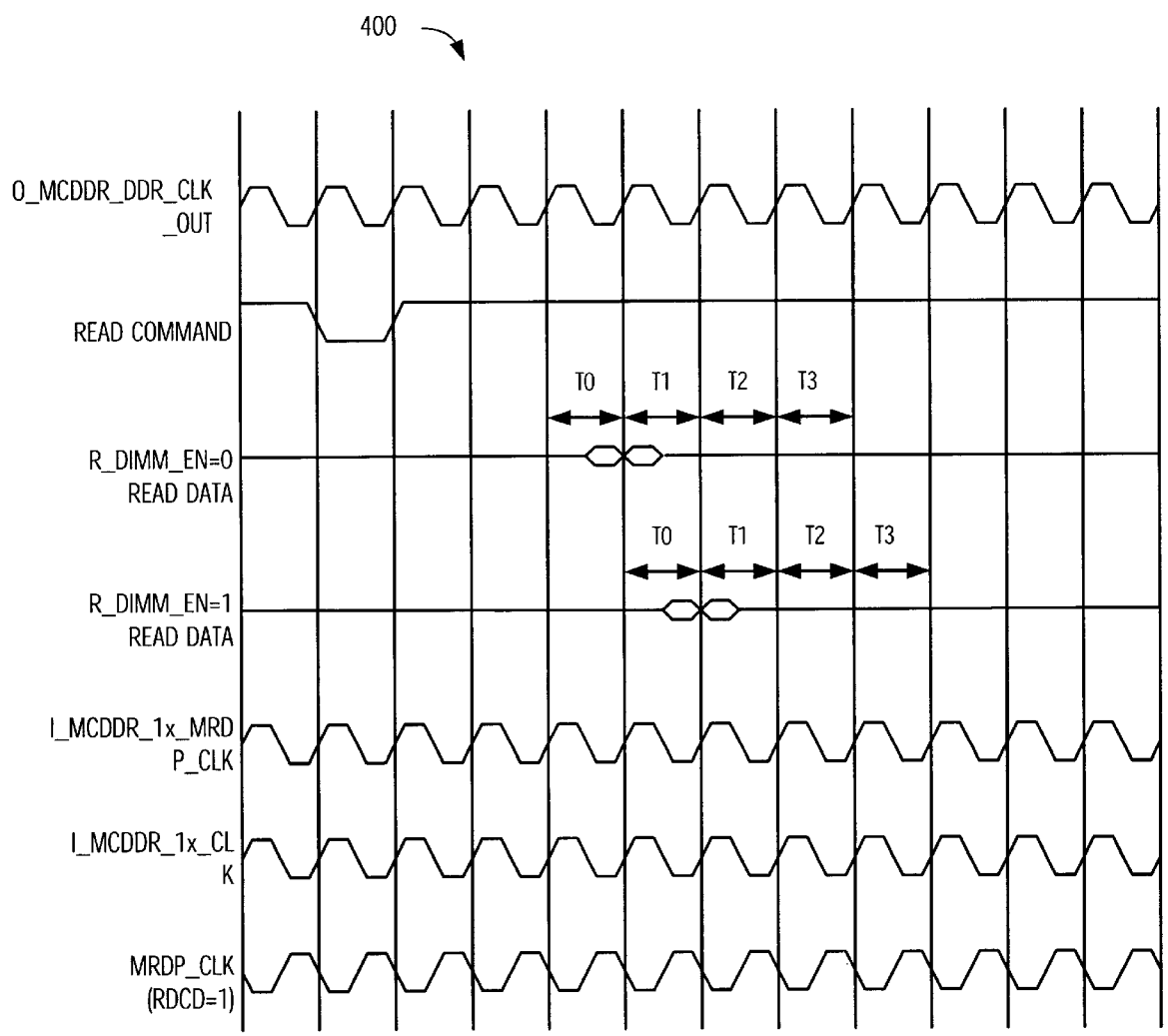
FIG. 4 depicts a timing diagram showing a read sample cycle for CAS Latency 2.5 devices.
Figure 5:
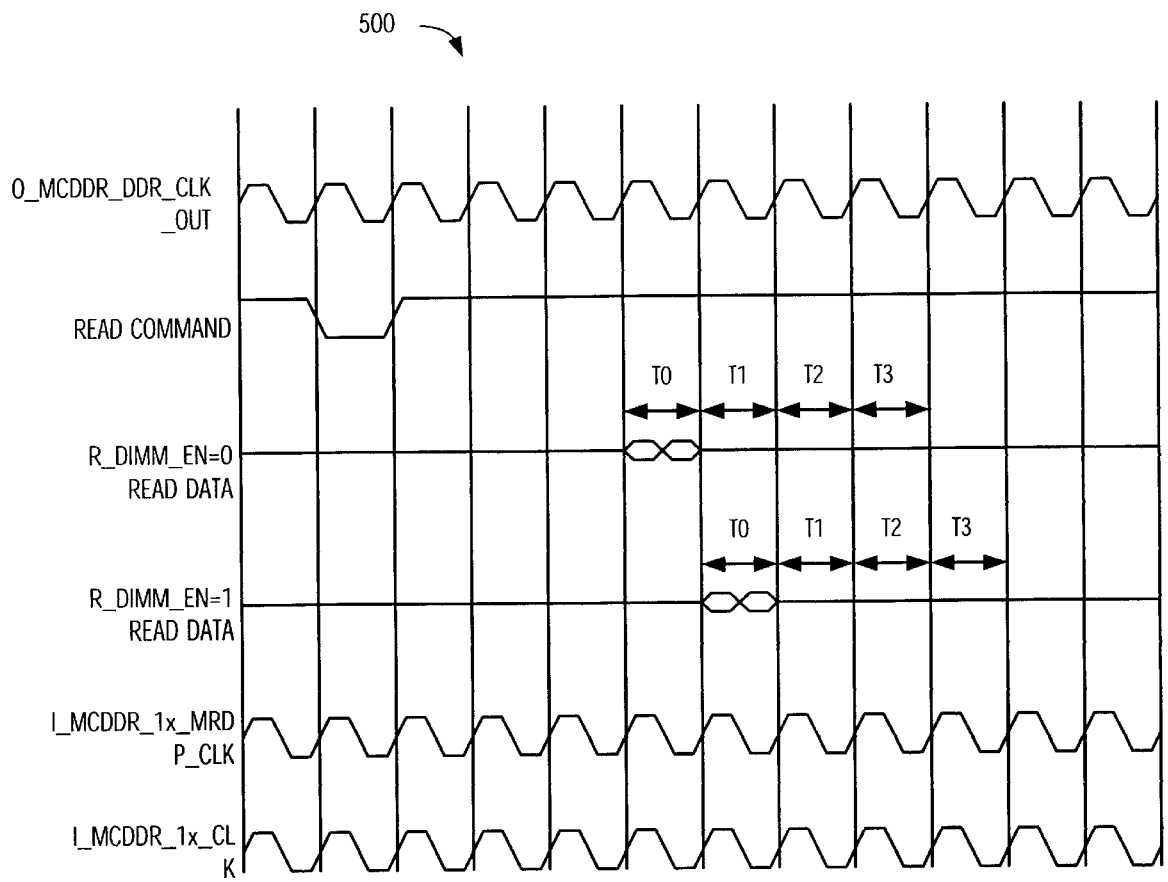
FIG. 5 depicts a timing diagram showing a read sample cycle for CAS Latency 3 devices.

The RDSS setting within SDTR2 determines the clock cycle, relative to the DDR read command, in which the internal logic should sample the read data at the PLB read sample point register 116 and 130. The relative cycles for the defined sample points are CAS Latency dependent and as depicted in FIGS. 3–5. Both unbuffered (R_DIMM_EN=0) and registered (R_DIMM_EN=1) interfaces (such as Registered DIMMs) are depicted as the configured sample point (and the arrival of the DDR read data) differs based on these two types of memory interfaces. RDSS must be configured, in conjunction with RDSL bits, to select the source and sample point for the incoming read data.

Now referring to FIG. 3, the timing diagram 300 shows the sample cycle, as configured by RDSS bits, for CAS Latency 2 devices. For CAS Latency 2 devices, the DDR device (not shown) launches read data nominally coincident with the second rising edge of its memory clock following the cycle in which the read command was sampled by the device (not shown). READ_COMMAND, as depicted, represents the read command launched from the DDR memory controller. Both registered (R_DIMM EN=1) and non-registered (R_DIMM_EN=0) DDR memory interfaces are depicted.

A T0 sample configures the DDR memory controller to sample incoming read data into the PLB read sample point registers 116 and 130 at the end of cycle TO. This is the end of the first cycle in which both upper and lower data were launched from the DDR device.

A T1 sample configures the DDR memory controller to sample incoming read data into the PLB read sample point registers 116 and 130 at the end of cycle T1. This is the end of the second cycle, relative to the cycle in which both upper and lower data were launched from the DDR device.

A T2 sample configures the DDR memory controller to sample incoming read data into the PLB read sample point registers 116 and 130 at the end of cycle T2. This is the end of the third cycle, relative to the cycle in which both upper and lower data were launched from the DDR device.

A T3 sample configures the DDR memory controller to sample incoming read data into the PLB read sample point registers 116 and 130 at the end of cycle T3. This is the end of the fourth cycle, relative to the cycle in which both upper and lower data were launched from the DDR device.

Now referring to FIG. 4, the timing diagram 400 shows the sample cycle, as configured by RDSS, for CAS Latency 2.5 devices. For CAS Latency 2.5 devices, the DDR device launches read data nominally coincident with the third falling edge of its memory clock following the cycle in which the read command was sampled by the device. Note the depicted half cycle delay (RDCD=1) on MRDP_CLK to enable read data capture into Stage 2 to compensate for the ½ latency adder (associated with CAS Latency 2.5 devices) and resultant mismatch with the internal read sample clock and to allow proper synchronization with the internal memory controller clock domain. READ_COMMAND, as depicted, represents the read command launched from the DDR memory controller.

A T0 sample configures the DDR memory controller to sample incoming read data into the PLB read sample point registers 116 and 130 at the end of cycle T0. This is the end of the first half-cycle from which both upper and lower data were launched from the DDR device.

A T1 sample configures the DDR memory controller to sample incoming read data into the PLB read sample point registers 116 and 130 at the end of cycle T1. This is the end of the third half cycle, relative to the first half cycle in which both upper and lower data were launched from the DDR device.

A T2 sample configures the DDR memory controller to sample incoming read data into the PLB read sample point registers 116 and 130 at the end of cycle T2. This is the end of the fifth half cycle, relative to the first half cycle in which both upper and lower data were launched from the DDR device.

A T3 sample configures the DDR memory controller to sample incoming read data into the PLB read sample point registers 116 and 130 at the end of cycle T3. This is the end of the seventh half cycle, relative to the first half cycle in which both upper and lower data were launched from the DDR device.

Now referring to FIG. 5, the timing diagram 500 shows the sample cycle, as configured by RDSS, for CAS Latency 3 devices. For CAS Latency 3 devices, the DDR device launches read data nominally coincident with the third rising edge of its memory clock following the cycle in which the read command was sampled by the device. READ_COMMAND, as depicted, represents the read command launched from the DDR memory controller.

A T0 sample configures the DDR memory controller to sample incoming read data into the PLB read sample point registers 116 and 130 at the end of cycle T0. This is the end of the first cycle in which both upper and lower data were launched from the DDR device.

A T1 sample configures the DDR memory controller to sample incoming read data into the PLB read sample point registers 116 and 130 at the end of cycle T1. This is the end of the second cycle, relative to the cycle in which both upper and lower data were launched from the DDR device.

A T2 sample configures the DDR memory controller to sample incoming read data into the PLB read sample point registers 116 and 130 at the end of cycle T2. This is the end of the third cycle, relative to the cycle in which both upper and lower data were launched from the DDR device.

A T3 sample configures the DDR memory controller to sample incoming read data into the PLB read sample point registers 116 and 130 at the end of cycle T3. This is the end of the fourth cycle, relative to the cycle in which both upper and lower data were launched from the DDR device.

Although the above description and FIGS. 1–5 describe a read data path structure of a DDR SDRAM interface, the present invention is generally applicable any DDR source-synchronous interface.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A read data path structure in a double data rate (DDR) source-synchronous interface such as a DDR synchronous random access memory (SDRAM) interface, the read data path structure comprising:
    a first stage comprising a first flip-flop (FF) and a transparent latch (XL);
    a second stage comprising a second FF and a third FF, the input of the second FF being connected to the output of the first FF, the input of the third FF being connected to the output of the XL;
    a third stage comprising a fourth FF and a fifth FF, the input of the fourth FF being connected to the output of the second FF, the input of the fifth FF being connected to the output of the third FF;
    a first multiplexer having at least one input connected to the output of the first FF, at least one input connected to the output of the second FF, and at least one input connected to the output of the fourth FF, the first multiplexer being controlled by at least two bits of an SDRAM timing register; and
    a second multiplexer having at least one input connected to the output of the XL, at least one input connected to the output of the third FF, and at least one input connected to the output of the fifth FF, the second multiplexer being controlled by the at least two bits of the SDRAM timing register.

2. The read data path structure of claim 1, further comprising:
    a first ECC and DP-muxing circuit having an input connected to the output of the first multiplexer;
    a first read sample point register having an input connected to the output of the first ECC and DP-muxing circuit;
    a second ECC and DP-muxing circuit having an input connected to the output of the second multiplexer; and
    a second read sample point register having an input connected to the output of the second ECC and DP-muxing circuit.

3. The read data path structure of claim 1, wherein the first FF is configured for being clocked by a read data strobe (DQS), and wherein the XL is configured for being clocked by an inverted read DQS.

4. The read data path structure of claim 1, further comprising a programmable delay and an XOR gate, the programmable delay controlled by one or more bits of the SDRAM timing register, the XOR gate having at least first and second inputs, the first input being connected to the output of the programmable delay, the second input being connected to the output of the SDRAM timing register, the second and third FFs being clocked by the output of the XOR gate.

5. The read data path structure of claim 1, further comprising a programmable delay and an XOR gate, the programmable delay controlled by one or more bits of the SDRAM timing register, the XOR gate having at least first and second inputs, the first input being connected to the output of the programmable delay, the second input being connected to the output of the SDRAM timing register, the second and third FFs being clocked by the output of the XOR gate, wherein the amount of delay made by the programmable delay being controlled by one or more bits of the SDRAM timing register, and wherein the second input of the XOR gate receives one bit of the SDRAM timing register.

6. The read data path structure of claim 1, further comprising a programmable delay and an XOR gate, the programmable delay controlled by one or more bits of the SDRAM timing register, the XOR gate having at least first and second inputs, the first input being connected to the output of the programmable delay, the second input being connected to the output of the SDRAM timing register, the second and third FFs being clocked by the output of the XOR gate, wherein the amount of delay made by the programmable delay being controlled by one or more bits of the SDRAM timing register, wherein the second input of the XOR gate receives one bit of the SDRAM timing register, wherein the one or more bits of the SDRAM timing register controlling the programmable delay is used to fine-tune the phase delay of the output signal of the XOR gate and the third FFs, and wherein the one bit input to the XOR gate is used to determine whether the output signal of the XOR gate is delayed half cycle.

7. The read data path structure of claim 1, wherein the fourth and the fifth FFs and the first and the second read sample point registers are configured for being clocked by a main core clock.

8. The read data path structure of claim 1, further comprising first and second buffers and an inverter, the input of the first buffer receiving read data, the input of the second buffer and the input of the inverter receiving read DQS, the output of the first buffer being connected to the input of the first FF, the output of the second buffer being connected to the clock input of the first FF, the output of the inverter being connected to the clock input of the XL.

9. The read data path structure of claim 1, wherein the first FF, the second FF, the fourth FF, the first multiplexer, the first ECC and DP-muxing circuit, and the first read sample point register constitutes an upper data path, and wherein the XL, the third FF, the fifth FF, the second multiplexer, the second ECC and DP-muxing circuit, and the second read sample point register constitutes a lower data path.

10. The read data path structure of claim 1, wherein the first FF, the second FF, the fourth FF, the first multiplexer, the first ECC and DP-muxing circuit, and the first read sample point register constitutes an upper data path, wherein the XL, the third FF, the fifth FF, the second multiplexer, the second ECC and DP-muxing circuit, and the second read sample point register constitutes a lower data path, wherein the data in the upper data path is captured into the first FF with the rising edge of read DQS, and wherein the data in the lower data path flushes through the XL when the read DQS is high and captured and held with the falling edge of read DQS.

* * * * *

UNITED STATES PATENT AND TRADEMARK OFFICE
CERTIFICATE OF CORRECTION

PATENT NO. : 6,493,285 B1
DATED : December 10, 2002
INVENTOR(S) : Wolford

It is certified that error appears in the above-identified patent and that said Letters Patent is hereby corrected as shown below:

Column 3,
Lines 9 and 10, delete "I_LMCDDR_1x_CLK" and insert -- I_MCDDR_1x_CLK --
Line 10, both occurrences, delete "1xclock" and insert -- 1x clock --

Signed and Sealed this

Twelfth Day of August, 2003

JAMES E. ROGAN
*Director of the United States Patent and Trademark Office*